(12) United States Patent
Neuhauser

(10) Patent No.: US 9,482,694 B2
(45) Date of Patent: Nov. 1, 2016

(54) DEVICE FOR MEASURING ELECTRONIC COMPONENTS

(71) Applicant: ROSENBERGER HOCHFREQUENZTECHNIK GMBH & CO. KG, Fridolfing (DE)

(72) Inventor: Roland Neuhauser, Fridolfing (DE)

(73) Assignee: Rosenberger Hochfrequenztechnik GmbH & Co., KG, Fridolfing (DE)

(*) Notice: Subject to any disclaimer, the term of this patent is extended or adjusted under 35 U.S.C. 154(b) by 37 days.

(21) Appl. No.: 14/382,393

(22) PCT Filed: Mar. 7, 2013

(86) PCT No.: PCT/EP2013/000674
§ 371 (c)(1),
(2) Date: Sep. 2, 2014

(87) PCT Pub. No.: WO2013/131651
PCT Pub. Date: Sep. 12, 2013

(65) Prior Publication Data
US 2015/0097591 A1    Apr. 9, 2015

(30) Foreign Application Priority Data
Mar. 8, 2012  (DE) .................. 20 2012 002 391 U

(51) Int. Cl.
*G01R 1/04* (2006.01)
*G01R 1/067* (2006.01)
*G01R 31/319* (2006.01)

(52) U.S. Cl.
CPC ............ *G01R 1/0408* (2013.01); *G01R 1/067* (2013.01); *G01R 1/06772* (2013.01); *G01R 31/31926* (2013.01)

(58) Field of Classification Search
CPC ....... G01R 1/04; G01R 1/067; G01R 1/0408
See application file for complete search history.

(56) References Cited

U.S. PATENT DOCUMENTS

| | | | |
|---|---|---|---|
| 5,384,532 A * | 1/1995 | Uhling | G01R 1/06766 324/72.5 |
| 6,724,209 B1 | 4/2004 | Whitten | |
| 2006/0132158 A1* | 6/2006 | Miller | G01R 31/31713 324/754.07 |
| 2007/0194803 A1* | 8/2007 | Schwindt | B82Y 35/00 324/754.03 |
| 2007/0296422 A1* | 12/2007 | Miller | G01R 31/2889 324/754.07 |
| 2009/0128171 A1 | 5/2009 | Okumura | |
| 2012/0214433 A1* | 8/2012 | Shimizu | H03F 1/223 455/127.2 |
| 2015/0155109 A1* | 6/2015 | Entsfellner | G01R 1/206 200/5 A |

FOREIGN PATENT DOCUMENTS

JP    2004085377 A    3/2004

* cited by examiner

*Primary Examiner* — Jermele M Hollington
*Assistant Examiner* — Zannatul Ferdous
(74) *Attorney, Agent, or Firm* — DeLio, Peterson & Curcio, LLC; Robert Curcio

(57) ABSTRACT

A device for measuring electronic components having a plurality of conductors applied to a dielectric cable carrier, which conductors are each connected both to a contact finger and to a connection contact, such that a switch is integrated in at least one of the conductors, via which the conductor can be additionally connected to a ground connection.

8 Claims, 1 Drawing Sheet

DEVICE FOR MEASURING ELECTRONIC COMPONENTS

BACKGROUND OF THE INVENTION

1. Field of the Invention

The invention relates to a device for measuring electronic components, having a plurality of conductors applied to a dielectric conductor carrier, which conductors are each connected on the one hand to a contact finger and on the other hand to a connecting contact.

2. Description of Related Art

A device of the generic kind in the form of what is referred to as a wafer probe is known from, for example, DE 199 45 178 C2. Wafer probes of this kind are used for example for testing the operation and electric characteristics of electronic circuits formed from wafers, for which purpose the circuits are connected to a suitable measuring device via the connecting contacts. To do this, the wafer probe is applied to the wafer in such a way that its contact fingers make contact with the printed conductors at defined points.

It is known for wafer probes of this kind to be designed to have a plurality of contact fingers which are each intended to make contact at a different point of contact on the electronic component to be tested, and which are connected via respective conductors to appropriate connecting contacts ("multi-contact wafer probes"). For each of these individual contacts of the wafer probe, the paths followed by the electrical energy conducted via them, or by the signals conducted via them, may, as a function of the contact layout of the electronic component to be tested, be different.

In known multi-contact wafer probes, the function or path for the electrical energy or signals at each individual contact is matched to the contact layout of the electronic component to be tested. Therefore, to test a component having a different contact layout, a new wafer probe matched thereto has to be produced.

It is known for a total of three different paths to be provided, with what is provided as a first path being a direct or exclusive connection between the contact finger and the associated connecting contact. Another, second, path may be provided to provide this one contact finger, which has a conductor connecting it to a connecting contact, with, in addition, a connection to ground. In the case of the third path, the connection to ground is made via buffer members such in particular as a capacitor and a resistor.

SUMMARY OF THE INVENTION

Bearing in mind the problems and deficiencies of the prior art, it is therefore an object of the present invention to reduce the cost and complication of testing electronic components having different contact layouts.

This object is achieved by a device as claimed herein and delineated in the claims. Advantageous embodiments of the device according to the invention form the subject matter of the claims and can be seen from the description of the invention which appears below.

The above and other objects, which will be apparent to those skilled in the art, are achieved in the present invention which is directed to a device for measuring electronic components, comprising: a plurality of conductors; a dielectric conductor carrier; the plurality of conductors being applied to the dielectric conductor carrier and each connected on the one hand to a contact finger and on the other hand to a connecting contact for connection to a measuring device; and a switch incorporated in at least one of the plurality of conductors, via which the at least one of the plurality of conductors between a contact finger and a connecting contact, which conductor connects the contact finger and the connecting contact, can be connected in addition to a ground connection.

Each of the plurality of conductors may be connected to the ground connection via a respective switch. The connection to the ground connection may take place via at least one buffer member.

The switch may include at least three switched positions, in which case an associated conductor is not connected to a ground connection in a first switched position, is connected directly to the ground connection in a second switched position, and is connected to the ground connection via at least one buffer member in a third switched position.

The buffer member may comprise a capacitor and a resistor.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-2 of the drawings in which like numerals refer to like features of the invention.

The idea underlying the invention is to make a device of the generic kind for measuring electronic components (a multi-contact wafer probe) more flexible by making the function of at least one individual contact of the device, but preferably of every individual contact thereof, variable by means of a variability of the path followed by the electrical energy or the signals conducted via the said individual contact. This makes it possible for the device to be used to test a plurality of electronic components having different contact layouts. For this purpose, the function of the individual contacts merely has to be matched to the particular contact layout of the electronic component to be tested.

A device of the generic kind for measuring electronic components which comprises a plurality of conductors applied to a dielectric conductor carrier, which conductors are each connected to a contact finger and to a connecting contact, is therefore characterized in accordance with the invention in that a switch (preferably a mechanical one) is incorporated in at least one, and preferably all, of the conductors, via which the associated conductor can be connected in addition to a ground connection. Provision may preferably be made in this case for the connection to the ground connection to be made either directly or via at least one buffer member.

As a particular preference, provision is made for the switch to have at least three switched positions, in which case the associated conductor is not connected to a ground connection in a first switched position, is connected directly to the ground connection in a second switched position and is connected to the ground connection via at least one buffer member in a third switched position. This makes it possible for each of the individual contacts to assume that function which is relevant for the testing of electronic components, which makes for particularly high flexibility for matching up with different contact layouts on the electronic components to be tested.

The buffer member preferably comprises (at least) one capacitance (and in particular one capacitor) and (at least) one resistor.

Figure 1:
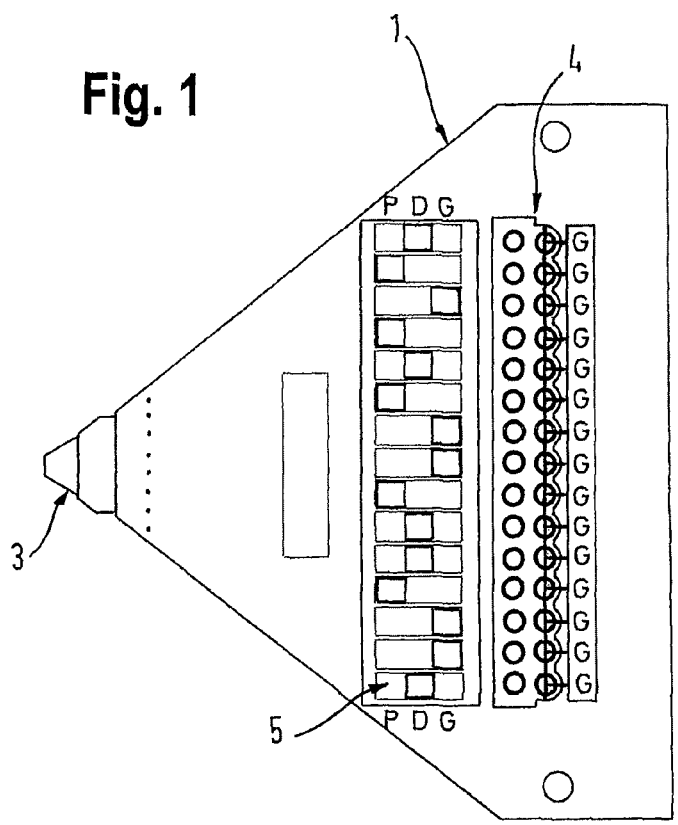
FIG. 1 is a plan view of a device according to the invention.

The device according to the invention which is shown in FIG. 1 comprises a dielectric conductor carrier 1 to the underside of which are applied a plurality of conductors 2 in the form of printed conductors. These printed conductors are arranged at a spacing from one another and are thus electrically isolated from one another. To form an individual contact, each of the conductors 2 is connected on the one hand to a (resilient) contact finger 3 made of an electrically conductive material. The contact fingers 3, which are intended to make contact with printed conductors or other electrical items on an electronic component to be tested (not shown), project beyond the conductor carrier 1 and terminate substantially along a line. Each of the conductors 2 is also connected to a connecting contact 4 in the form of what is referred to as a DC pin. The device is connected to a measuring device (not shown) via these connecting contacts 4.

In accordance with the invention, a switch 5 (a conventional miniature switch) is incorporated in each of the conductors 2. Each of these switches 5 has three, alternative, switched positions. In a first switched position, indicated as "D" in FIGS. 1 and 2, there is a direct or exclusive electrical connection between the given contact finger 3 and the associated connecting contact 4. If the switches 5 are moved to the (second) switched position, which is indicated as "G" in FIGS. 1 and 2, there is an additional connection made to a ground connection 6.

Figure 2:
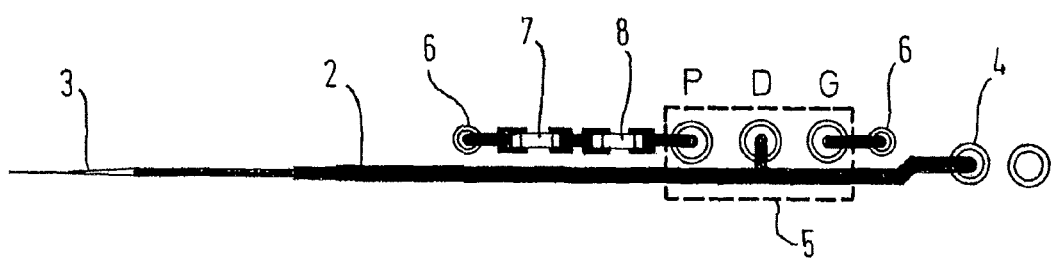
FIG. 2 is a schematic view showing the possible switched positions of each individual contact of the device according to the invention shown in FIG. 1, together with the paths resulting therefrom.

In the case of the switched position which is indicated as "P" in FIGS. 1 and 2, provision is likewise made for an additional connection to a ground connection 6, but this takes place via an intervening buffer member. This buffer member comprises a (preferably firmly defined) capacitor 7 (e.g. 10 nF) and a (preferably firmly defined) resistor 8 (e.g. 2.2Ω).

As function of the contact layout of the electronic component to be tested, the plurality of switches 5 can each be switched in such a way that a path matched to the contact layout is set for each of the individual contacts.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A device for measuring electronic components, comprising:
   a plurality of conductors;
   a dielectric conductor carrier;
   said plurality of conductors being applied to said dielectric conductor carrier and each connected on the one hand to a contact finger and on the other hand to a connecting contact for connection to a measuring device; and
   a switch incorporated in at least one of said plurality of conductors, wherein the switch has at least two switched positions, wherein in the first switched position there is a direct or exclusive electrical connection between said contact finger and the associated connecting contact, wherein in the second switched position, there is a direct or exclusive electrical connection between said contact finger and the associated connecting contact and an additional contact to a ground connection.

2. The device of claim 1, wherein each of the plurality of conductors can be connected to said ground connection via a respective switch.

3. The device of claim 1 wherein the connection to the ground connection takes place via at least one buffer member.

4. The device of claim 1 wherein the switch includes at least three switched positions, in which case an associated conductor is not connected to a ground connection in a first switched position, is connected directly to the ground connection in a second switched position, and is connected to the ground connection via at least one buffer member in a third switched position.

5. The device of claim 3, wherein the buffer member comprises a capacitor and a resistor.

6. The device of claim 2 wherein the connection to the ground connection takes place via at least one buffer member.

7. The device of claim 2 wherein the switch includes at least three switched positions, in which case an associated conductor is not connected to a ground connection in a first switched position, is connected directly to the ground connection in a second switched position, and is connected to the ground connection via at least one buffer member in a third switched position.

8. The device of claim 4, wherein the buffer member comprises a capacitor and a resistor.

* * * * *